(12) United States Patent
Martinez-Limia et al.

(10) Patent No.: US 12,713,636 B2
(45) Date of Patent: Aug. 18, 2026

(54) METHOD FOR MANUFACTURING A POWER TRANSISTOR AND POWER TRANSISTOR

(71) Applicant: Robert Bosch GmbH, Stuttgart (DE)

(72) Inventors: Alberto Martinez-Limia, Tuebingen (DE); Franziska Felicitas Fink, Juelich (DE); Jan-Hendrik Alsmeier, Pfullingen (DE); Stephan Schwaiger, Bodelshausen (DE); Wolfgang Feiler, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 462 days.

(21) Appl. No.: 17/595,781

(22) PCT Filed: May 26, 2020

(86) PCT No.: PCT/EP2020/064504

§ 371 (c)(1),
(2) Date: Jan. 11, 2022

(87) PCT Pub. No.: WO2020/239725

PCT Pub. Date: Dec. 3, 2020

(65) Prior Publication Data

US 2022/0231148 A1 Jul. 21, 2022

(30) Foreign Application Priority Data

May 27, 2019 (DE) ..................... 10 2019 207 761.7

(51) Int. Cl.
*H10D 30/01* (2025.01)
*H10D 30/66* (2025.01)
(Continued)

(52) U.S. Cl.
CPC ....... *H10D 30/0297* (2025.01); *H10D 30/668* (2025.01); *H10D 62/127* (2025.01); *H10D 62/8325* (2025.01); *H10D 62/8503* (2025.01)

(58) Field of Classification Search
None
See application file for complete search history.

(56) References Cited

U.S. PATENT DOCUMENTS 7,843,004 B2 11/2010 Darwish
8,076,719 B2 12/2011 Zeng et al.
(Continued)

FOREIGN PATENT DOCUMENTS

DE 102005009000 A1 9/2006
EP 1168455 A2 1/2002
(Continued)

OTHER PUBLICATIONS

International Search Report for PCT/EP2020/064504 Issued Oct. 1, 2020.

*Primary Examiner* — Jay C Chang
(74) *Attorney, Agent, or Firm* — NORTON ROSE FULBRIGHT US LLP

(57) ABSTRACT

A method for manufacturing a power transistor. The method includes: applying a first epitaxial layer including a first doping concentration to a front side of a semiconductor substrate, producing an expansion layer, which is situated inside the first epitaxial layer, producing various implanted areas starting from the front side of the semiconductor substrate, producing a trench structure starting from the front side of the semiconductor substrate, producing first isolation areas in the surroundings of the trench structure, producing transistor heads, and applying metal layers.

9 Claims, 2 Drawing Sheets

(51) Int. Cl.
*H10D 62/10* (2025.01)
*H10D 62/832* (2025.01)
*H10D 62/85* (2025.01)

(56) References Cited

U.S. PATENT DOCUMENTS

| | | | | |
|---|---|---|---|---|
| 8,390,060 | B2 | 3/2013 | Darwish et al. | |
| 9,698,217 | B1 * | 7/2017 | Baba | H01L 29/10 |
| 2005/0126471 | A1 * | 6/2005 | Jenny | C30B 33/00 117/92 |
| 2012/0034780 | A1 * | 2/2012 | Shih | H01L 21/0337 438/692 |
| 2012/0049902 | A1 * | 3/2012 | Corona | H01L 29/7322 257/77 |
| 2013/0214348 | A1 | 8/2013 | Takeda | |
| 2014/0246718 | A1 | 9/2014 | Taketani et al. | |
| 2016/0126348 | A1 * | 5/2016 | Deng | H01L 29/4236 438/270 |
| 2016/0359029 | A1 * | 12/2016 | Zeng | H10D 64/518 |
| 2019/0122926 | A1 | 4/2019 | Darwish et al. | |
| 2020/0395449 | A1 * | 12/2020 | Matsuda | H01L 21/02579 |

FOREIGN PATENT DOCUMENTS

| | | | |
|---|---|---|---|
| JP | 2015138958 | A | 7/2015 |
| JP | 2017152487 | A | 8/2017 |
| JP | 2017183604 | A | 10/2017 |

* cited by examiner 200
210
209
207
204
203
208
206
205
212
208
202
201
211
w
y
x

METHOD FOR MANUFACTURING A POWER TRANSISTOR AND POWER TRANSISTOR

FIELD

The present invention relates to a method for manufacturing a power transistor, to a power transistor cell, and to a power transistor.

BACKGROUND INFORMATION

The gate oxide of a n-trench MOSFET is protected in the blocking mode from high field strengths by deep-reaching, highly-doped p-regions. The highly-doped regions have a greater depth than the trenches.

It is disadvantageous here that the conductivity of the transistor is negatively affected in the forward operation.

Expansion layers below the trenches may be used for improving the conductivity of the transistor in the forward operation. Setting the doping concentration is problematic.

An object of the present invention is to overcome this disadvantage.

SUMMARY

A method according to an example embodiment of the present invention for manufacturing a power transistor includes applying a first epitaxial layer having a first doping concentration to a front side of a semiconductor substrate and producing an expansion layer, which is situated inside the first epitaxial layer. The method includes producing various implanted areas starting from the front side of the semiconductor substrate, producing a trench structure starting from the front side of the semiconductor substrate, and producing first isolation areas in the surroundings of the trench structure. The method furthermore includes producing transistor heads and applying metal layers.

An advantage here is that the conductivity of the power transistor is high in the forward operation, a high blocking strength being ensured at the same time.

In one refinement of the present invention, the expansion layer is produced by increasing the first doping concentration during a certain duration upon the application of the first epitaxial layer.

It may be advantageous here that the expansion layer may be manufactured in a simple and cost-effective manner.

In another embodiment of the present invention, the expansion layer is produced with the aid of implantation of dopants.

An advantage here is that the doping concentration of the expansion layer is precisely settable.

In one refinement of the present invention, the trench structure is produced with the aid of a hard mask made of silicon dioxide in that the hard mask is elevated after structuring and is reduced with the aid of dry etching.

It may be advantageous here that very narrow trenches may be produced in a simple and cost-effective manner, so that the feedback capacitance of the power transistor is reduced.

In another embodiment of the present invention, the first isolation areas are enlarged or elevated in the area of trench openings and below gate contacts with the aid of a structured mask.

An advantage here is that a gate oxide breakthrough may be delayed or prevented.

In one refinement of the present invention, prior to the application of the first epitaxial layer, a second epitaxial layer is applied to the front side of the semiconductor substrate, so that a second epitaxial layer is situated between the front side of the semiconductor substrate and the first epitaxial layer, the second epitaxial layer including a doping profile which decreases starting from a transition of the front side of the semiconductor substrate to the second epitaxial layer to a transition of the second epitaxial layer to the first epitaxial layer.

It may be advantageous here that a smooth transition is manufactured between the doping concentration of the front side of the semiconductor substrate and the first epitaxial layer.

In accordance with an example embodiment of the present invention, the power transistor cell includes a semiconductor substrate which includes a front side and a rear side, the front side being opposite to the rear side. An epitaxial layer is situated on the front side. Channel regions are situated on the epitaxial layer. Source regions are situated on the channel regions. A trench and field shielding regions extend from the front side of the semiconductor substrate into the epitaxial layer, the field shielding regions each being situated laterally spaced apart from the trench. The trench has a lesser depth than the field shielding regions. According to the present invention, an expansion region having a certain thickness is situated below the trench, first isolation areas being enlarged or elevated at certain points in the surroundings of the trench and the trench including a trench width of between 300 nm and 1200 nm, in particular a trench width of less than 850 nm.

An advantage here is that the conductivity of the power transistor in the forward operation is high, a high blocking strength being ensured at the same time. In addition, the feedback capacitance is low.

In one refinement of the present invention, the semiconductor substrate includes silicon carbide and gallium nitride.

Further advantages result from the following description of exemplary embodiments and the figures.

BRIEF DESCRIPTION OF THE DRAWINGS

The present invention is explained hereinafter on the basis of preferred specific embodiments and the figures.

DETAILED DESCRIPTION OF EXAMPLE EMBODIMENTS

Figure 1:
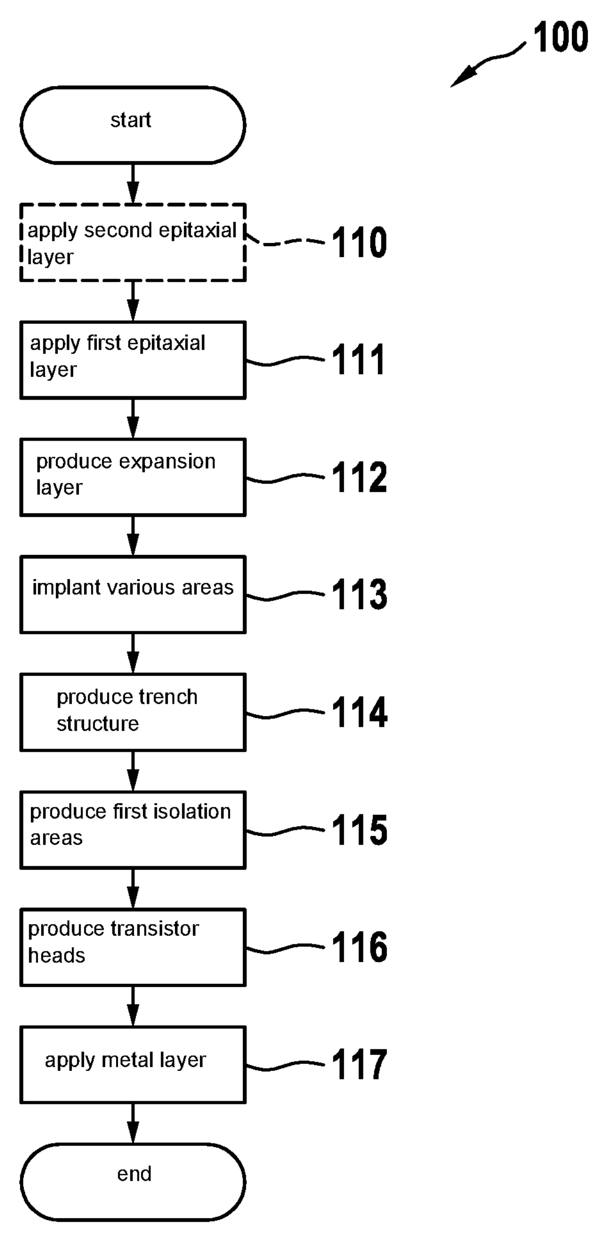
FIG. 1 shows a method for manufacturing a power transistor including an expansion region, in accordance with an example embodiment of the present invention.

FIG. 1 shows a method 100 for manufacturing a power transistor including an expansion region, in accordance with an example embodiment of the present invention. The method starts with a step 111 in which a first epitaxial layer including a first doping concentration is applied to a front side of a semiconductor substrate. The first epitaxial layer is applied with the aid of epitaxy. The first epitaxial layer includes the same semiconductor material as the semiconductor substrate, the doping concentration of the first epitaxial layer being different from the doping concentration of the semiconductor substrate.

In a following step 112, an expansion layer is produced, which is situated inside the first epitaxial layer. In one exemplary embodiment, the expansion layer is produced in that the first doping concentration is elevated during the application of the first epitaxial layer for a certain duration. In other words, the expansion layer is produced with the aid of epitaxy. Alternatively or additionally, an implantation of nitrogen as a dopant is carried out. The expansion layer is implanted with a certain doping concentration or the doping concentration of an epitaxially produced expansion layer is set. The implantation energy includes 0 MeV to 5 MeV, multiple implantation energies and doses in the range of 1e11 atoms/cm$^2$ to 1e15 atoms/cm$^2$ being used.

In a following step 113, various areas are implanted starting from the front side of the semiconductor structure. Field shielding structures, edge areas, channel regions, and source regions are produced with the aid of standard processes. The field shielding structures are implanted, for example, with the aid of an aluminum doping having a dose in the range of 1e13 atoms/cm$^2$ to 1e16 atoms/cm$^2$ and an implantation energy between 0 MeV and 5 MeV, so that the field shielding structures are p-doped. The edge areas of the semiconductor chip are also produced with the aid of aluminum doping in the energy range between 0 MeV and 5 MeV, the doping dose being lower than in the case of the field shielding structures. The source regions are produced with aid of nitrogen doping using a dose between 1e14 atoms/cm$^2$ and 1e16 atoms/cm$^2$. This takes place using an implantation energy less than 200 keV. The channel regions are produced with the aid of aluminum doping using a dose between 1e12 atoms/cm$^2$ and 1e14 atoms/cm$^2$. The implantation energy is less than 1 MeV.

To activate the implanted dopants, after the implantations a carbonaceous layer, for example, photoresist, is applied to the front side of the semiconductor substrate or semiconductor wafer, so that in the subsequent high-temperature step at a temperature between 1600° C. and 2100° C., roughening of the semiconductor surface is prevented or minimized.

In a following step 114, a trench structure is produced starting from the front side of the semiconductor substrate. Trenches are produced with the aid of a hard mask, for example, made of silicon dioxide, in that the hard mask is elevated after structuring and is reduced with the aid of dry etching. The trench width of the individual trenches is between 300 nm and 1200 nm. The trenches have a depth of 500 nm to 2000 nm. In addition, the trench edges may be rounded at a temperature between 1300° C. and 1600° C., so that high field peaks and therefore current breakthroughs may be reduced at the trenches.

In a following step 115, first isolation areas are produced in the surroundings of the trench structure. The first isolation areas are enlarged in the area of trench openings and below gate contacts with the aid of a structured mask. For this purpose, a first dielectric medium is deposited on the trench surfaces, which has a layer thickness between 30 nm and 400 nm, and thereafter the trenches are filled using a polycrystalline, crystalline, or amorphous silicon. The silicon is then structured, so that it functions as a mask. Areas of the first dielectric material are thus exposed, so that further oxide may be deposited to thicken the first isolation areas. The silicon is subsequently removed and in a second part of the gate oxide, a thickness of 30 nm to 100 nm is applied to the wafer by a deposition process. The gate oxide thus has a layer thickness between 20 nm and 350 nm at certain points, these being the trench ends and areas below the gate contact. In the active area, the thickness of the gate oxide corresponds to the thickness of the oxide which was deposited in the second part. In other words, the gate dielectric medium is thickened at certain points, which are subjected to high field strengths during operation of the power transistor, so that an oxide breakthrough of the power transistor may be prevented or delayed. Subsequently, the semiconductor wafer is heated in $N_2$, NO, or N2O atmosphere in a temperature range of 1150° C. to 1400° C. The interface between the gate dielectric medium and the semiconductor substrate is thus changed. The electric mobility in the channel thus improves.

In a following step 116, transistor heads are produced with the aid of standard processes. For this purpose, gate electrodes made of polycrystalline, highly-doped silicon are deposited and structured using a mask, for example. The second isolation layer is deposited, which includes, for example, $SiO_2$ with or without boron or phosphorus doping. Subsequently, the contacts are opened and etched with the aid of a suitable mask.

In a following step 117, initially a metal layer is applied to the front side of the semiconductor wafer. This includes, for example, a metal stack made of Ti/TiN/AlCu, Ti/TiW/AlCu, or Ti/AlCu. The layer thicknesses are 20 nm to 200 nm for Ti, 0 nm to 150 nm for TiN or TiW, and 3 μm to 5 μm for AlCu. The copper component of AlCu may be up to 1%. Alternatively to AlCu, AlSiCu may be used, the silicon component being up to 5%. A silicon nitride layer or a silicon oxynitride layer and a polyimide layer are subsequently applied to the front side of the semiconductor substrate, which are opened for electrical contacting.

Optionally, a currentless deposition of Ni/Pd/Au may be manufactured as an over-pad metallization above the gate terminals. This has the advantage that gold may be sintered in the further processing of the semiconductor wafer. The layer thicknesses are, for example, 500 nm to 3000 nm for nickel, up to 500 nm for palladium, and 10 nm to 100 nm for gold.

Finally, a further metal layer is deposited on the rear side of the semiconductor substrate, which is opposite to the front side, with the aid of a sputtering process. The layer thickness of the semiconductor substrate is possibly decreased beforehand to a thickness between 100 μm and 200 μm, for example, with the aid of grinding. The metal layer includes Ti/Ni/Au or Ti/Ni/Ag here, nickel being able to include traces of vanadium.

Method 100 optionally starts with a step 110, in which a second epitaxial layer is applied to the front side of the semiconductor substrate. Method 100 is subsequently continued with step 111.

The ohmic contacts on the front side of the semiconductor substrate are produced between steps 116 and 117 with the aid of a high-temperature process, in that deposited nickel or deposited contaminated nickel on the upper side of the power transistor is silicided. The remaining nickel, i.e., the nickel component which is not silicided, is removed by wet chemistry. A further temperature step subsequently takes place. At the same time, the ohmic contacts may be produced on the rear side of the semiconductor substrate, which is opposite to the front side of the semiconductor substrate.

Figure 2:
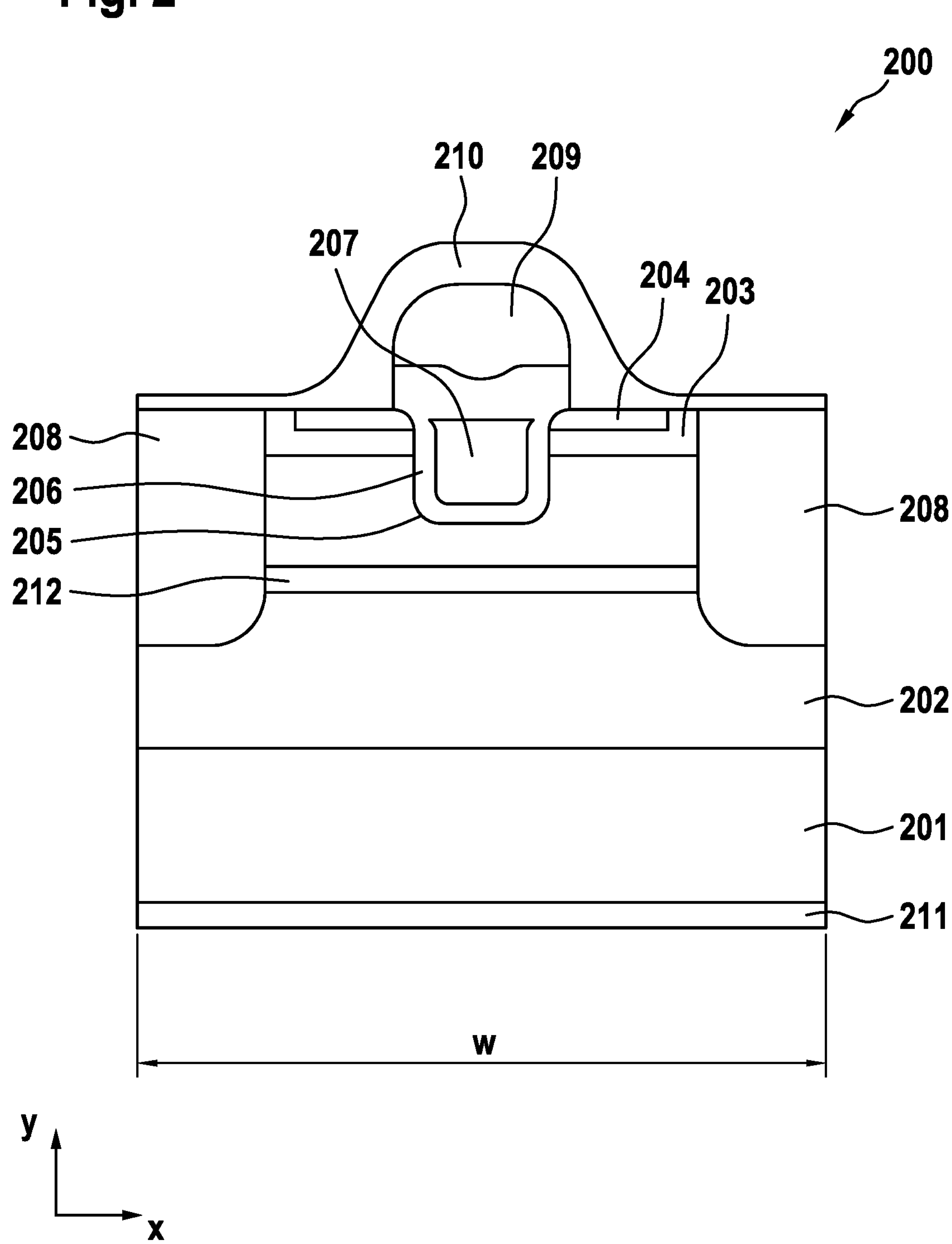
FIG. 2 shows a power transistor cell including an expansion region, in accordance with an example embodiment of the present invention.

FIG. 2 shows a power transistor cell 200 including a semiconductor substrate 201 which includes a front side and a rear side, the front side being opposite to the rear side.

Transistor cell 200 has a width w, the so-called pitch. An epitaxial layer 202 is situated on the front side of semiconductor substrate 201. Channel regions 203 or body regions are situated on epitaxial layer 202. Source regions 204 are situated on channel regions 203. A trench 205 and field shielding regions 208 extend from the front side of semiconductor substrate 201 into epitaxial layer 202. Trench 205 has a trench width of 300 nm to 1200 nm and a depth of 500 nm to 1500 nm. Field shielding regions 208 have a greater depth than trench 205. In other words, field shielding regions 208 extend deeper into epitaxial layer 202 than trench 205. Field shielding regions 208 have a lateral distance to trench 205. This means that field shielding regions 208 are situated laterally to the trench at a certain distance. An expansion region 212 having a certain thickness is situated below trench 205. The certain thickness is between 100 nm and 200 nm. Expansion region 212 may be epitaxially deposited, implanted, or epitaxially deposited with subsequent implantation step for precisely setting the doping concentration of expansion region 212. Expansion region 212 is thus situated between field shielding regions 208, field shielding regions 208 overlapping expansion region 212. Field shielding regions 208 are doped significantly higher than expansion region 212, so that field shielding regions 208 compensate for expansion region 212. Expansion region 212 is situated at a depth between 0.5 μm and 3 μm starting from the front side of semiconductor substrate 201. Expansion region 212 has a certain distance to trench 205 along a main extension direction y. Alternatively, expansion region 212 touches trench 205 and thus has no distance to trench 205. Expansion region 212 has the same charge carrier type as epitaxial layer 202, the doping concentration of the expansion region being higher than the doping concentration of epitaxial layer 202. The doping takes place in both cases using nitrogen, the doping concentration of expansion region 212 being between 1e15 1/$cm^3$ and 1e18 1/$cm^3$ and the doping concentration of epitaxial layer being between 1e15 atoms/$cm^2$ and 1e17 atoms/$cm^2$.

A first isolation layer or a first isolation area 206 is situated on a trench surface of trench 205. First isolation area 206 functions as a gate oxide and is enlarged or elevated at certain points in the surroundings of the trench, i.e., the first isolation area has a high layer thickness at points. The specific points are the trench ends, i.e., the area around the trench openings and areas below the gate pad. Trench 206 is filled, for example, using a polysilicon, the polysilicon functioning as a gate electrode 207. A second isolation area 209 is situated above trench 205. A metal layer 210 is situated on the front side of semiconductor substrate 201. Metal layer 210 functions as a front side metallization and represents the source terminal. Metal layer 210 includes, for example, a metal stack made of Ti/TiN/AlCu, Ti/TiW/AlCu, or Ti/AlCu. The layer thicknesses are 20 nm to 200 nm for Ti, 0 nm to 150 nm for TiN or TiW, and 3 μm to 5 μm for AlCu. The copper component of AlCu may be up to 1%. A further metal layer 211 is situated on the rear side of semiconductor substrate 201. Further metal layer 211 functions as a rear side metallization and represents the drain terminal. Further metal layer 211 includes, for example, Ti/Ni/Au or Ti/Ni/Ag.

Semiconductor substrate 201, epitaxial layer 202, channel regions 204, and expansion region 212 are n-doped. Source regions 203 and field shielding regions 208 are p-doped.

Alternatively, semiconductor substrate 201, epitaxial layer 202, channel regions 204, and implanted expansion region 212 are p-doped. Source regions 203 and field shielding regions 208 are n-doped.

Semiconductor substrate 201 includes silicon, silicon carbide, in particular 4H SiC including a nitrogen doping greater than 1e18 atoms/$cm^2$, or gallium nitride.

A power transistor includes a plurality of power transistor cells 200. Power transistor cells 200 are arrayed along a second main extension direction x, which is situated perpendicular to first main extension direction y. The power transistor includes a special formation of doped regions in the immediate surroundings of the trenches, a greater layer thickness in the sensitive regions of the trenches, and particularly narrow trenches. Such a transistor is, for example, a MOSFET.

The power transistor is used in power electronics components, such as inverters for electric vehicles or hybrid vehicles, inverters for photovoltaic systems and wind power systems, and in traction drives and high-voltage rectifiers.

What is claimed is:

1. A method for manufacturing a power transistor, comprising the steps:

applying a first epitaxial layer including a first doping concentration to a front side of a semiconductor substrate;

producing an expansion layer, which is situated inside the first epitaxial layer, producing various implanted areas starting from the front side of the semiconductor substrate;

producing a trench structure and field shielding regions starting from the front side of the semiconductor substrate and into the first epitaxial layer;

producing first isolation areas in surroundings of the trench structure;

producing transistor heads; and applying metal layers, wherein each of the field shielding regions are situated laterally spaced apart from the trench structure, and the trench structure has a lesser depth than the field shielding regions, wherein an entirety of the expansion region is situated below the depth of the trench structure, wherein the first isolation areas have an increased thickness in an area of trench ends and below gate contacts, wherein the expansion layer has a thickness of 0.5 μm to 3 μm, and is doped with a concentration between $1\times10^{15}$ atoms/$cm^3$ and $1\times10^{18}$ atoms/$cm^3$, and wherein the expansion layer overlaps with the field shielding regions.

2. The method as recited in claim 1, wherein the expansion layer is produced during the application of the first epitaxial layer for a certain duration by increasing the first doping concentration.

3. The method as recited in claim 1, wherein the expansion layer is produced using implantation of dopants.

4. The method as recited in claim 1, wherein the trench structure is produced with using a hard mask made of silicon dioxide, in that the hard mask is elevated after a structuring and is reduced using dry etching.

5. The method as recited in claim 1, wherein the first isolation areas in an area of trench openings and below the gate contacts are enlarged using a structured mask.

6. The method as recited in claim 1, wherein prior to the application of the first epitaxial layer, a second epitaxial layer is applied to the front side of the semiconductor substrate, so that the second epitaxial layer is situated between the front side of the semiconductor substrate and the first epitaxial layer, the second epitaxial layer including a dopant profile which decreases starting from a transition of the front side of the semiconductor substrate to the second epitaxial layer to a transition of the second epitaxial layer to the first epitaxial layer.

7. The method as recited in claim 1, further comprising:

producing channel regions at a front side of the first epitaxial layer; and producing source regions situated on the channel regions;

wherein the first isolation areas are elevated at certain points in surroundings of the trench;

wherein:

the expansion layer forms an expansion region of the power transistor, the expansion region being situated at a rear side of the trench; and the trench has a trench width of between 300 nm and 1200 nm.

8. The method as recited in claim 7, wherein the trench width is less than 850 nm.

9. The method as recited in claim 7, wherein the semiconductor substrate includes silicon carbide or gallium nitride.

* * * * *